United States Patent
Takahashi et al.

(10) Patent No.: US 7,040,943 B2
(45) Date of Patent: May 9, 2006

(54) METHOD FOR PRODUCING AN ORGANIC ELECTROLUMINESCENCE DISPLAY ELEMENT

(75) Inventors: Akira Takahashi, Yokohama (JP); Naoki Kato, Yokohama (JP); Shinji Kobune, Yokohama (JP)

(73) Assignee: OPTREX Corporation, Tokyo (JP)

( * ) Notice: Subject to any disclaimer, the term of this patent is extended or adjusted under 35 U.S.C. 154(b) by 207 days.

(21) Appl. No.: 10/703,507

(22) Filed: Nov. 10, 2003

(65) Prior Publication Data
US 2004/0208988 A1    Oct. 21, 2004

(30) Foreign Application Priority Data
Nov. 12, 2002 (JP) .............................. 2002-327927

(51) Int. Cl.
*H01J 9/44* (2006.01)
*H05B 33/10* (2006.01)
*H05B 33/14* (2006.01)

(52) U.S. Cl. .................... 445/6; 428/917; 428/690; 445/3

(58) Field of Classification Search ............... 445/5, 445/3
See application file for complete search history.

(56) References Cited

U.S. PATENT DOCUMENTS

| 4,412,155 A | * | 10/1983 | Isaka et al. | 315/246 |
| 4,949,019 A | * | 8/1990 | Isaka et al. | 315/246 |
| 6,626,717 B1 | * | 9/2003 | Miyashita et al. | 445/3 |

FOREIGN PATENT DOCUMENTS

| JP | 4-14794 | 1/1992 |
| JP | 10-208880 | 8/1998 |
| JP | 2001-313170 | 11/2001 |
| JP | 2001-338759 | 12/2001 |
| JP | 2002-198172 | 7/2002 |
| JP | 2002-203672 | 7/2002 |
| JP | 2003-282253 | 10/2003 |

* cited by examiner

*Primary Examiner*—Mariceli Santiago
*Assistant Examiner*—Anne M Hines
(74) *Attorney, Agent, or Firm*—Oblon, Spivak, McClelland, Maier & Neustadt, P.C.

(57) ABSTRACT

A method for aging an organic electroluminescence display element where the integration value with respect to an applied voltage and a voltage application time in a reverse direction is at least twice as much as in a forward direction.

20 Claims, 3 Drawing Sheets

*(where initial value is 100%)

Fig. 4

*(where initial value is 100%)

Fig. 5

Fig. 6

METHOD FOR PRODUCING AN ORGANIC ELECTROLUMINESCENCE DISPLAY ELEMENT

BACKGROUND OF THE INVENTION

1. Field of the Invention

The present invention relates to a method for producing an organic electroluminescence (hereinbelow, abbreviated as the organic EL) display element.

2. Discussion of Background

Along with the rapid progress in the technical developments in the information communication field in recent years, more expectations are placed on flat display devices instead of CRTs. Among them, an organic EL display element is excellent in the high response, visibility, luminance, etc. and various studies are being made thereon.

The organic EL display element announced by Tang et al. of Eastman Kodak, U.S.A. in 1987 has a two-layered lamination structure of thin organic films wherein tris (8-quinolinolato) aluminum (hereinbelow, abbreviated as "Alq") as represented by the below-mentioned formula (III) is used for a light emitting layer, by which a high luminance as 1000 $cd/m^2$ was obtained by driving it with a low voltage of 10V or less. This organic EL display element was an element emitting a green color light having a luminous efficiency of 1.5 lm/W (see, for example, Non-patent Document 1).

Formula (III)

With respect to the organic EL display element, however, it is known that the luminance per current density decreases as the emission time passes. Accordingly, it is important to suppress such a luminance decrease rate and to improve the emission luminance lifetime of the organic EL display element.

As a method for improving the emission luminance lifetime of the organic EL display element, studies have been made on a method of using a material having high heat resistance for the hole transport layer or a method of doping a dye for extending the lifetime in the light emitting layer.

Further, in attention to characteristics that the luminance decreasing in a continuous voltage application time is remarkable at the initial stage of the continuous voltage application time, an aging method capable of suppressing the luminance deterioration to obtain stable characteristics for a long term has been proposed.

As aging methods, a method of supplying a high density of current (see, for example, Patent Document 1), a method of applying a forward or reverse stair-like undulation voltage to the light emitting layer until it reaches the voltage value for driving under the condition that the potential of the anode is higher than the potential of the cathode (see, for example, Patent Document 2) and a method of stabilizing the organic EL display element by a heat treatment of 50° C. or higher (see, for example, Patent Document 3), have been proposed. However, even by such treatments, the effect of improving the emission luminance lifetime is still insufficient.

Patent Document 1: JP-A-8-185979 (paragraph No. 0009)
Patent Document 2: JP-A-4-14794 (scope of the claim)
Patent Document 3: JP-A-5-182764 (paragraph Nos. 0012–0014)
Patent Document 4: JP-A-2-311591 (scope of the claim)
Patent Document 6: JP-A-2-289675 (scope of the claim)
Patent Document 7: JP-A-2-216791 (scope of the claim)
Patent Document 8: JP-A-1-245087 (scope of the claim)
Patent Document 9: JP-A-3-33183 (scope of the claim)
Patent Document 10: JP-A-5-331459 (paragraph Nos. 0005–0014)
Patent Document 11: JP-A-7-90260 (paragraph No. 0019)
Non-patent Document 1: "Applied Physics Letter", U.S.A., 1987, Vol. 51, p. 913
Non-patent Document 2: "Applied Physics Letter", U.S.A., 1991, Vol. 59, p. 2760
Non-patent Document 3: "Applied Physics Letter", U.S.A., 1997, Vol. 70, p. 152

It is an object of the present invention to provide a method for producing an organic EL display element for improving the emission luminance lifetime and stabilizing emission characteristics. It is another object and advantages of the present invention will be made clear from the following description.

SUMMARY OF THE INVENTION

In accordance with Embodiment 1 of the present invention, there is provided a method for producing an organic electroluminescence display element having a light emitting layer between an anode and a cathode, which is characterized in that operations are carried out in the combination of aging in a forward direction wherein a voltage is applied to the light emitting layer under the condition that the potential of the anode is higher than the potential of the cathode and aging in a reverse direction wherein a voltage is applied to the light emitting layer under the condition that the potential of the cathode is higher than the potential of the anode, and the integration value with respect to an applied voltage and a voltage application time in the aging in a reverse direction is at least twice as much as the integration value with respect to an applied voltage and a voltage application time in the aging in a forward direction.

According to Embodiment 2 of the present invention, there is provided the method for producing an organic electroluminescence display element described in the above Embodiment 1 wherein aging is carried out at an environment temperature of from 50° C. to 110° C.

According to Embodiment 3 of the present invention, there is provided the method for producing an organic electroluminescence display element described in the above Embodiment 1 or 2 wherein aging is carried out until the luminance per current density becomes 90% of the initial value.

According to Embodiment 4 of the present invention, there is provided the method for producing an organic electroluminescence display element described in the above Embodiment 1, 2 or 3 wherein aging is carried out until the change of the luminance per current density shows a monotonous reduction.

According to Embodiment 5 of the present invention, there is provided the method for producing an organic electroluminescence display element described in the above Embodiment 1, 2, 3 or 4 wherein the light emitting layer is composed of a compound A represented by the formula (III), a fluorescent dye and a compound B represented by the formula (II), and the proportion of the fluorescent dye is from 0.1 to 10 mol % and the proportion of the compound B is from 1 to 50 mol % based on the total amount of the compound A, the fluorescent dye and the compound B:

Formula (III)

Formula (II)

1: Substrate
2: Anode
3: Light emitting layer
4: Cathode
5: Hole transport layer
6: Interface layer
7: Electron transport layer
8: Interface layer

DETAILED DESCRIPTION OF THE PREFERRED EMBODIMENTS

In the following, some practical embodiments of the present invention will be described with reference to figures, a table, formulas and examples. However, these figures, the table, formulas and examples and description are exemplification of the present invention, and these do not limit the scope of the present invention. Of course, other practical embodiments belong to the scope of the present invention as long as these embodiments meet the spirit of the present invention. In the figures, the same reference numerals designate the same elements.

Usually, the deterioration curve of an organic EL display element in a continuous voltage application time exhibits a remarkable reduction at the initial stage of continuous voltage application time as indicated by the curve 31 in FIG. 3 (which will be described later) and is unstable. Therefore, aging wherein a voltage is applied across the anode and the cathode of the organic EL display element and the applied voltage is kept for a predetermined time in a state of continuous voltage application to the light emitting layer of the organic EL display element, has an effect of suppressing the luminance decreasing due to the subsequent voltage application, and is effective.

As a result of studies, it was found to be effective when aging in a forward direction wherein a voltage is applied to the light emitting layer under the condition that the potential of the anode is higher than the potential of the cathode and aging in a reverse direction wherein a voltage is applied to the light emitting layer under the condition that the potential of the cathode is higher than the potential of the anode, are carried out in combination.

The aging in a forward direction wherein a voltage is applied to the light emitting layer under the condition that the potential of the anode is higher than the potential of the cathode, has an effect of causing beforehand the initial deterioration of the organic EL display element while light is emitted from the organic EL display element. However, the aging in a reverse direction has particularly an effect of reducing previously the portion affecting largely the deterioration of the organic EL display element by feeding a minute current in a non-light-emission state of it, and an effect of rearranging molecules in the light emitting layer to stabilize the change of luminance. As another effect of the aging, an effect of repairing a leaking portion in the organic EL display element can be mentioned. For this effect, both of the aging in a forward direction and the aging in a reverse direction are effective.

Figure 1:
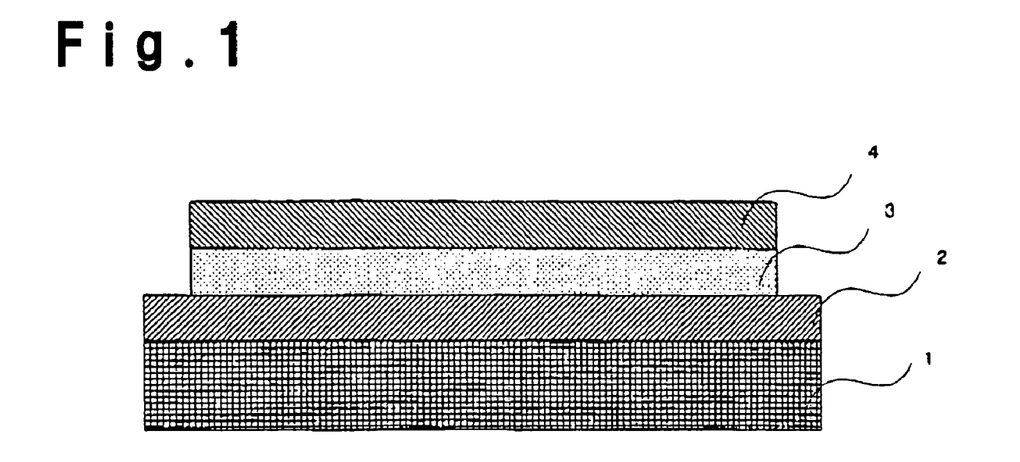
FIG. 1 is a schematic cross-sectional view illustrating the basic structure of the organic EL display element of the present invention.
Figure 2:
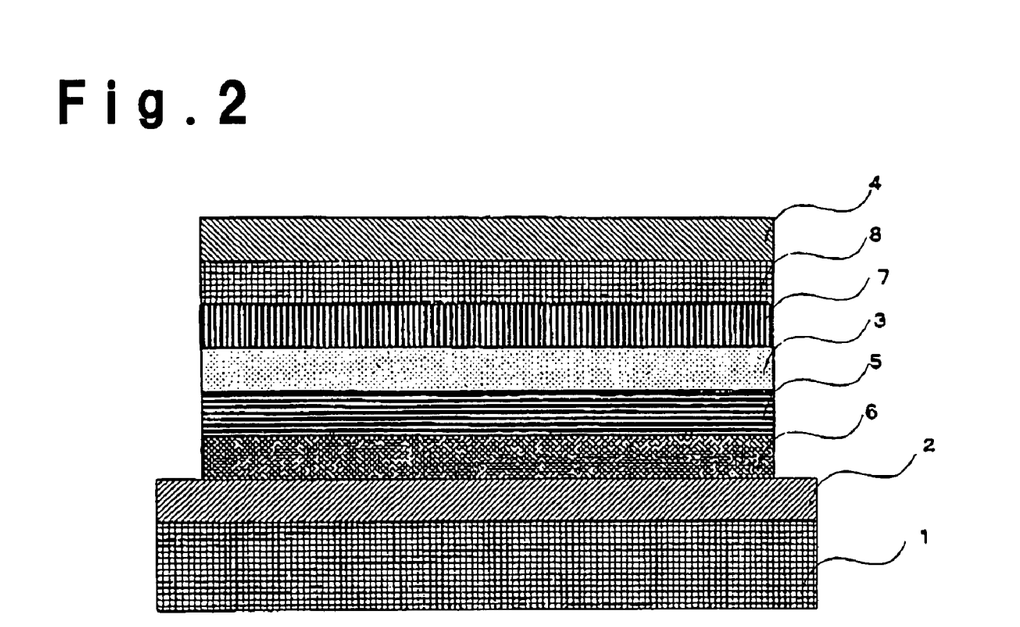
FIG. 2 is a schematic cross-sectional view illustrating an applied embodiment of the organic EL display element of the present invention.

The organic EL display element used in the present invention will be described according to drawings. FIG. 1 is a schematic cross-sectional view illustrating the basic structure of the organic EL display element of the present invention, and FIG. 2 is a schematic cross-sectional view of its applied embodiment.

In FIG. 1, the organic EL display element is formed by laminating a substrate 1, an anode 2, a light emitting layer 3 and a cathode 4 in this order. In FIG. 2, a hole interface layer 6 and a transport layer 5 are provided between the anode 2 and the light emitting layer 3, and an electron transport layer 7 and an interface layer 8 are provided between the cathode 4 and the light emitting layer 3.

In the present invention, the substrate 1 is a support of the organic EL display element, and it is common to employ a transparent substrate of e.g. glass, a plastic film or the like. The plastic may, for example, be a polycarbonate, a polymethacrylate, a polysulfone or the like.

The anode 2 is a transparent electrode and is formed on the substrate 1. As the transparent electrode, a thin film of an indium tin oxide (ITO) or a film of a tin oxide may be used. Or, it may be constituted by an inorganic electrically conductive material such as a metal such as silver, gold or the like or copper iodide having a large work function, or an electrically conductive polymer such as a poly(3-methylthiophene), polypyrrole, a polyaniline or the like.

As a method for producing such an anode, it is common to employ a vacuum vapor deposition method, a sputtering method or the like. However, in the case of an electrically conductive polymer, a thin film may be prepared by coating a solution thereof with a suitable binder, on the substrate, or such a thin film may be directly formed on the substrate by electrolytic polymerization. The thickness of the anode depends on the required transparency. The transmittance of a visible light is usually required to be at least 60%, preferably at least 80%, and in such a case, the thickness is usually from 5 to 1000 nm, preferably, from 10 to 500 nm.

In the basic structure, the light emitting layer 3 is formed on the anode 2. As the material for the light emitting layer 3, a compound having a high fluorescent quantum yield, a high electron injection efficiency from the cathode 4 and a high electron mobility is effectively used, and a known light emitting organic material can be used.

In the present invention, a 8-oxyquinoline type complex represented by the following formula (1) can be used preferably.

Formula (I)

In the above-mentioned chemical formula, each of $A^1$ to $A^6$ which are independent of one another, is a hydrogen atom, a halogen atom, a nitro group, a hydroxyl group, a cyano group, a $C_{1-12}$ alkyl group, a $C_{1-12}$ alkoxy group, an aryl group, an aryloxy group, an acyl group, an arylamine group, an aralkyl group, an alkylamine group or an aromatic hydrocarbon group, M is a metal atom, n is an integer of from 1 to 3, L is an alkoxy group or an aryloxy group, and p is an integer of from 0 to 2 respectively. Some of hydrogen atoms in the above groups may be substituted by halogen atoms, and an oxygen atom may be inserted between a carbon-carbon bond in the above groups.

The metal atom M in this 8-oxyquinoline type complex may, for example, be lithium, silver, beryllium, magnesium, calcium, strontium, zinc, cadmium, aluminum, gallium, indium, thallium, yttrium, scandium, lanthanum, lead, zirconium, manganese or lutetium. Among them, it is possible to preferably use a complex having, as the center metal, beryllium, magnesium, aluminum, zinc or scandium, having a high fluorescent quantum yield.

In addition to these, tetraphenylbutadiene, a styryl type dye, an oxadiazole type dye or the like may be used for the light emitting organic material of the light emitting layer.

The film thickness of such a light emitting layer 3 is usually from 10 to 200 nm, preferably, from 20 to 80 nm.

Further, it is also effective, as a method for improving the luminous efficiency of the organic EL display element and at the same time, enabling a full-colored display, to dope another dye material having a high fluorescent quantum yield in the light emitting layer. As such doping dye material, a known fluorescent organic material may be used.

For example, dye for laser such as a stilbene type dye, an oxazole type dye, a cyanine type dye, a xanthene type dye, an oxazine type dye, a coumarin type dye, an acridine type dye or the like, an aromatic hydrocarbon type material such as an anthracene derivative, a naphthacene derivative, a penthacene derivative, a pyrene derivative, a perylene derivative or the like, DCM (dicyanomethylene-6-(p-dimethylaminostyryl)-2-methyl-4H-pyran) derivative, an europium complex, a phenylpyridine iridium complex or the like, can widely be used. The concentration of such doping organic material in the light emitting layer is preferably from 0.01 to 20 mol %.

The aging effect of the present invention is applicable to the general construction for an organic EL display element. However, it is particularly preferable in the case that the light emitting layer has electron transporting properties and hole transporting properties.

For example, there is considered a system in which a 8-oxyquinoline type complex and a hole transport material are mixed in the light emitting layer. This hole transport material is not particularly limited, but 4,4'-bis(N-(1-naphthyl)-N-phenylamino)biphenyl(NPD) represented by the following formula (II), N,N'-bis(phenanthrene-9-yl)-N,N'-bis-phenylbenzidine(PPD) or the like may, for example, be mentioned. Further, the construction that the before-mentioned dye material having a high fluorescent quantum yield is doped, is preferably employed.

Formula (II)

As the method for producing the light emitting layer, various methods may be used such as a vacuum vapor deposition method, a dipping method, a spin coating method, an LB method (Langmuir-Blodgett method) etc. In order to prepare a uniform thin film of a submicron order free from defects such as pinholes etc., a vacuum vapor deposition method or a spin coating method is particularly preferred.

When doping is carried out, a method of sublimating materials mixed in a predetermined ratio from a single boat or crucible or a method of sublimating the plurality of materials separately from a plurality of boats, may be employed in the case of the vacuum vapor deposition method. In the case of the spin coating method, it is preferred to dissolve the plurality of materials in a predetermined ratio in a solvent, followed by film-forming.

The hole transport layer 5 may be provided between the anode 2 and the light emitting layer 3, as the case requires, as shown in FIG. 2. As the hole transport material used for the hole transport layer 5, a material having a low hole injection barrier with respect to the anode 2 and a high hole mobility may be used.

For such hole transport material, a known hole transport material may be used. For example, an aromatic diamine compound such as N,N'-diphenyl-N,N'-bis(3-methylpheny)-1,1'-biphenyl-4,4'-diamine(TPD), 1,1'-bis(4-di-p-tolylaminophenyl)cyclohexane or the like, or the before-mentioned NPD, PPD or a hydrazone compound (see, for example, Patent Document 4) may be used. Further, a polymer material such as poly-N-vinylcarbazole or polysilane may also be preferably used (see, for example, Non-Patent Document 2).

As the material for the hole transport layer, not only the above-mentioned organic material, but also an inorganic material such as a metal-chalcogen compound, a metal halide, a metal carbide, nickel oxide, lead oxide, copper iodide, a p-type compound semiconductor such as lead sulfide, or a p-type hydrogenated amorphous silicon semiconductor, or a p-type hydrogenated amorphous silicon carbide or the like may be used. Further, it is preferable to form a layer by mixing the above-mentioned hole transport materials.

In order to improve the heat resistance or the uniformity of the thin film of the hole transport layer, a resin which is not likely to be a trap for holes may be used as the binder in admixture with the hole transport material. As such a binding resin, polyether sulfone, polycarbonate, polyester or the like may be mentioned. The content of the binding resin is preferably from 10 to 50 mass %, not to reduce the hole mobility. In a case where either an organic material or an inorganic material is used, the film thickness of the hole transport layer is usually from 10 to 200 nm, preferably from 20 to 80 nm.

The interface layer 6 may be formed between the anode 2 and the hole transport layer 5 in order to prevent a leak current, to reduce a hole injection barrier, and to improve the adhesiveness. As such interface layer material, 4,4',4"-tris{N-(3-methylphenyl)-N-phenylamino}triphenylamine (hereinafter, abbreviated as "MTDATA"), 4,4',4"-tris{N,N'diphenylamino}triphenylamine (hereinafter, abbreviated as "TDATA"), copper phthalocyanine, or the like may preferably be used (see, for example, Patent Document 5). In a case where the interface layer 6 is provided, the film thickness is preferably from 5 to 100 nm.

The cathode 4 is provided on the light emitting layer 3. As the material for the cathode, various materials may be used including the known cathode materials for an organic EL display element. For example, a magnesium/aluminum alloy, a magnesium/silver alloy, a magnesium/indium alloy, an aluminum/lithium alloy or aluminum may be mentioned.

The electron transport layer 7 may be provided, as the case requires, between the light emitting layer 3 and the cathode 4. As the electron transport material for this electron transport layer 7, a material having a high electron affinity and a large electron mobility should be used. As a material satisfying such conditions, a cyclopentadiene derivative (see, for example, Patent Document 6), an oxadiazole derivative (see, for example, Patent Document 7), a bis-styrylbenzene derivative (see, for example, Patent Document 8), a p-phenylene compound (see, for example, Patent Document 9), a phenanthroline derivative (see, for example, Patent Document 10), a triazole derivative (see, for example, Patent Document 11) may be mentioned.

The interface layer 8 may be provided as the case requires, between the electron transport layer 7 and the cathode 4. By providing such an interface layer, it is possible to attain reduction of the driving voltage, improvement of the luminous efficiency or prolongation of the lifetime. Such interface layer has an effect to facilitate injection of electrons from the cathode or an effect to improve the adhesiveness to the cathode.

As the material for the interface layer, an alkali metal fluoride such as lithium fluoride(see, for example, Non-patent Document 3), a fluoride of an alkaline earth metal, or an oxide of an alkali metal or an alkaline earth metal such as magnesium oxide, strontium oxide, aluminum oxide or lithium oxide, may be mentioned. In a case where such a material is an insulating material by itself, the film thickness to be used is usually as thin as not more than 5 mm, preferably at most 2 mm, whereby tunnel injection of electrons from the cathode is considered to be possible. Further, an organic substance such as a β-diketon complex of an alkali metal or an alkaline earth metal is preferred. With respect to these layers, each layer by itself may be formed of a plurality of layers, or another layer may be interposed therebetween as far as these layers can function as the organic El display element.

As methods for producing the hole transport layer 5, the interface layer 6, the cathode 4, the electron transport layer 7 and the interface layer 8, various known methods may be used such as a vacuum vapor deposition method, a dipping method, a spin coating method, an LB method, a chemical vapor deposition method (CVD method) etc. In order to prepare a uniform thin film of submicron order free from defects such as pinholes, a vacuum vapor deposition method or a spin coating method is particularly preferred.

In the organic EL display element of the present invention, in order to secure the storage stability and driving stability in the atmosphere, it is preferred that the polymer film or the inorganic protecting film is subjected to coating to seal the gap between substrates whereby oxygen or moisture in the atmosphere is blocked. However, it is preferred that a small amount of oxygen is contained in the sealed space, since such will provide an effect to suppress short circuiting. Further, it is also preferred to seal a water-capturing agent in the sealed space.

Description will be made with respect to aging in the method for producing an organic EL display element of the present invention.

In the present invention, the aging is carried out in the combination of aging in a forward direction wherein a voltage is applied to the light emitting layer under the condition that the potential of the anode is higher than the potential of the cathode and aging in a reverse direction wherein a voltage is applied to the light emitting layer under the condition that the potential of the cathode is higher than the potential of the anode.

The timing of the aging may be at any stage during the manufacture of the organic EL display element as long as the condition of applying a voltage to the light emitting layer is satisfied. Further, it may be after the organic EL display element has been completed.

The aging may be carried out in an environmental atmosphere of nitrogen or air. There is no particular limitation as to the environmental temperature for the aging, and it is possible to carry out the aging at the room temperature. However, the temperature is preferably from 50° C. to 110° C. because such temperature range can accelerate the aging and prevent each part of the organic EL display element from damaging by heat.

The aging in a forward direction and the aging in a reverse direction may be combined as desired. For example, after the aging in either direction has been carried out for a predetermined time, the aging in the opposite direction may be carried out for a predetermined time, or the aging in a forward direction and the aging in a reverse direction may be switched plural times. In this case, there is no particular limitation of the number of times. Either a direct current or an alternate current is applicable. The combination of a direct current and an alternate current is usable. A rectangular wave may be used.

When the aging in a forward direction is carried out, a large electric current usually follows in comparison with the case of operating the organic EL display element. On the other hand, when the aging in a reverse direction is carried out, an electric current does not flow substantially. In the case of the aging in a forward direction, an applicable voltage is preferably from 5 to 40V and an electric current to be supplied is preferably from 5 to 1000 mA/cm$^2$. The applicable voltage in the aging in a reverse direction is preferably from 10 to 50V.

The aging in a forward direction and the aging in a reverse direction provide different effects as described above. However, they have also a synergy effect. For this, it is important that they are carried out under predetermined condition because different effects appear with respect to the improvement of the emission luminance lifetime depending on a proportion of the aging in a forward direction to the aging in a reverse direction.

As such predetermined condition, it was found to be appropriate that the integration value with respect to an applied voltage and a voltage application time in the aging in a reverse direction is at least twice as much as the integration value with respect to an applied voltage and a voltage application time in the aging in a forward direction. Here, "the integration value with respect to an applied voltage and a voltage application time" means the product of the applied voltage and the voltage application time in a case that a temporal change of the applied voltage is plotted in a graph having the abscissa as the voltage application time and the ordinate as the applied voltage. When a constant voltage is applied, the product of the applied voltage and a voltage application time corresponds to such integration value.

Figure 3:
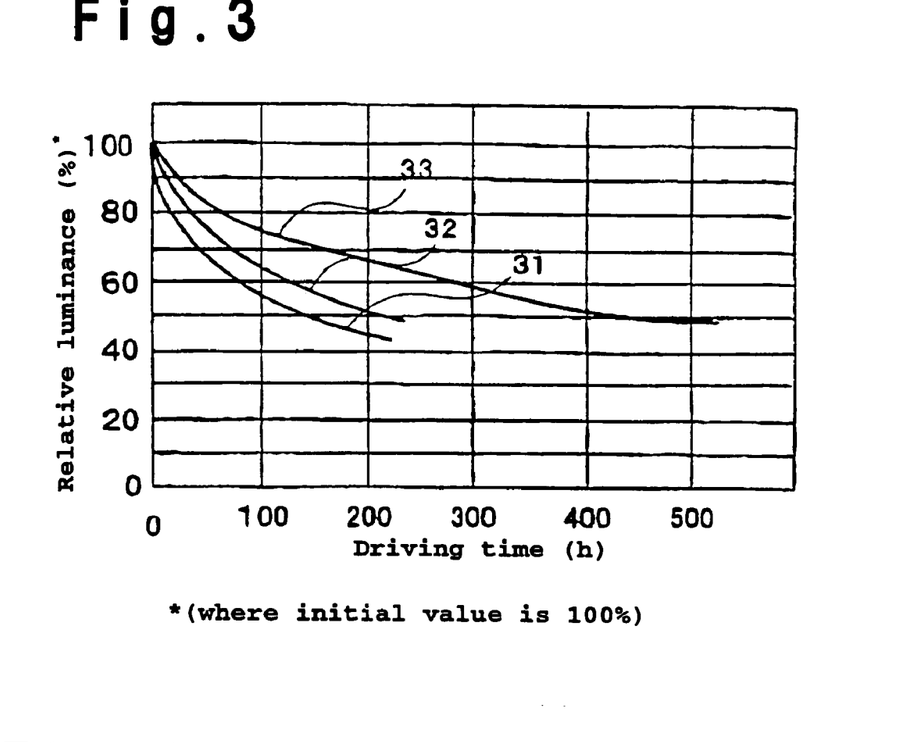
FIG. 3 is a graph showing a temporal change of the luminance per current density of the organic EL display element.

FIG. 3 is a diagram in which a curve 31 indicates a temporal change of the luminance per current density in a case that the aging according to the present invention is not carried out, a curve 32 indicates a temporal change of the luminance per current density in a case that only the aging in a forward direction is carried out, and a curve 33 indicates a temporal change of the luminance per current density in a case that the aging according to the present invention is carried out. It is understood in comparison of curves 31 to 33 that when the aging according to the present invention is carried out, the temporal change of the luminance per current density decreases in comparison with the case that no aging is carried out or the case that only the aging in a forward direction is carried out. Namely, when the aging according to the present invention is carried out as indicated by the curve 33, an organic EL display element capable of improving the emission luminance lifetime and stabilizing emission characteristics can be produced.

With respect to how much the aging should be carried out, it is preferred to carry out the aging until the luminance per current density reaches a predetermined range. For example, the aging should be carried out until the luminance per current density reaches 90% of the initial value or the aging be carried out until it reaches 80% of the early stage. However, the degree of the aging can be determined appropriately depending on applications and objects.

It has been revealed that there is a case that a temporal change of the luminance per current density without conducting the aging is not monotonous but has a convex portion although it depends on the structure of the light emitting layer. The presence of such convex portion is likely to cause a dispersion in the luminance for each pixel along with using the organic EL display element, which is an undesirable phenomenon.

Figure 4:
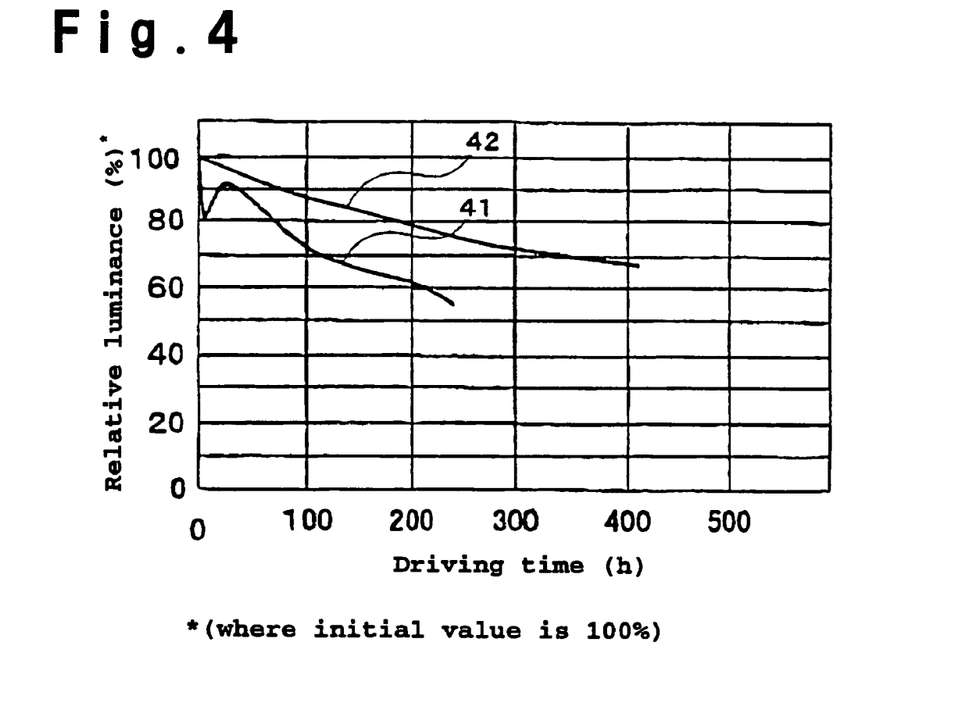
FIG. 4 is another graph showing a temporal change of the luminance per current density of the organic EL display element.

As an example, a case that the light emitting layer is constituted by a compound A represented by formula (III), a fluorescent dye and a compound B represented by formula (II) may be mentioned. When the proportion of the fluorescent dye is from 0.1 to 10 moL % and the proportion of the compound B is from 1 to 50 moL % based on the total amount of the compound A, the fluorescent dye and the compound B, this structure can realize the prolongation of the lifetime of the light emitting layer of the organic electroluminescence display element. However, there is a case that the temporal change of the luminance per current density without conducting the aging is not monotonous wherein the convex portion as indicated by a curve 41 in FIG. 4 appears.

With respect to this, it has been revealed that such convex portion can be eliminated by the aging of the present invention. Namely, the monotonous reduction in the change of the luminance per current density is obtainable as indicated by a curve 42 in FIG. 4, and the emission characteristics can be stabilized. As the judging standard as to how much the aging of the present invention should be carried out, there is a useful method that the aging is carried out until the change of the luminance per current density shows a monotonous reduction.

The thus obtained organic EL display element improves the emission luminance lifetime. Accordingly, it is useful as an organic EL display element usable for a display in which pixels are formed by patterning an anode, a cathode and an insulation layer into a desired shape. Further, it may be used as a large-sized surface emission member to be used as a backlight for a liquid crystal display element or a wall illumination element. Even when the organic EL display element is used as such an illumination element, it belongs to the scope of the organic EL display element of the present invention.

EXAMPLES

In the following, specific embodiments of the present invention will be described with reference to Examples and Comparative Examples. Cases 5 to 7 and 10 are Examples and Cases 1 to 4, 8 and 9 are Comparative Examples.

A time in which the luminance decreased by a half was measured under conditions of 20° C., a constant current driving (100 mA/cm$^2$) and a nitrogen atmosphere. Results are described in Table 1.

In Table 1, the forward accumulation value indicates the product (Vh) of a voltage applied in a forward direction and a voltage application time in an aging time; the reverse accumulation value indicates the product (Vh) of a voltage applied in a reverse direction and a voltage application time in an aging time; the aging time indicates the sum of an aging time in a forward direction and an aging time in a reverse direction, and the environment temperature indicates the temperature during aging. Further, the emission luminance lifetime indicates a time in which the emission luminance becomes a half of the initial value.

[Case 1]

Figure 5:
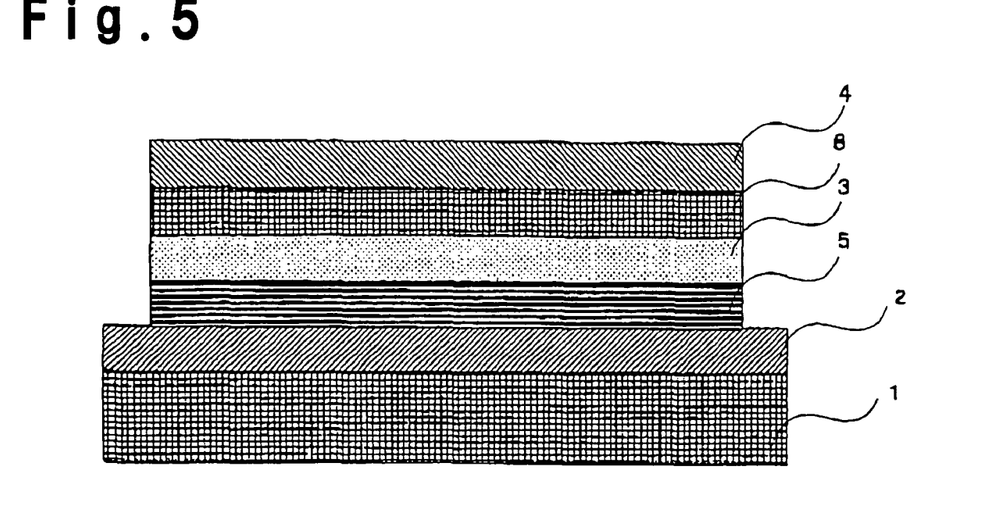
FIG. 5 is a schematic cross-sectional view illustrating another applied embodiment of the organic EL display element of the present invention.

On a glass substrate, ITO was vapor-deposited in a thickness of 200 nm to form an anode 2 having a sheet resistance of 7Ω/□. On this anode 2, NPD represented by the formula (II) was vapor-deposited by a vacuum vapor deposition method to form a hole transport layer 5 having a film thickness of 60 nm. Then, on the hole transport layer, Alq of the formula (III) and coumarin 545T of the following formula (IV) were co-vapor-deposited by means of separate boats to form a light emitting layer 3 in a film thickness of 60 nm.

Formula (IV)

The concentration of the coumarin 545T in the light emitting layer 3 was 1.0 mol %. On the light emitting layer, a layer of LiF having a thickness of 0.5 nm as an interface layer 8 and an aluminum layer having a thickness of 200 nm as a cathode 4 were vapor-deposited sequentially to prepare an organic EL display element as shown in FIG. 5. The vacuum degree at that time was 0.00107 Pa.

As aging to the organic EL display element, driving was carried out for 40 hours (at a frequency of 50 Hz) by repeating alternately the application of continuous 10 ms of a forward bias voltage of 12V and the application of continuous 10 ms of a reverse bias voltage of 15V. The environment temperature was 20° C.

This organic EL display element was energized under conditions of 20° C., and a constant current driving (100 mA/cm$^2$) in a nitrogen atmosphere to emit light, and the time in which the luminance decreased to a half value was measured.

By the aging, the luminance per current density was 93% of the initial value. Subsequently, the change of the luminance per current density showed a monotonous reduction.

[Case 2]

Operations up to the measurement of the emission luminance lifetime were carried out in the same manner as Case 1 except that aging after the formation of the films in Case 1 was not carried out. The change of the luminance per current density showed a monotonous reduction.

[Case 3]

Operations up to the measurement of the emission luminance lifetime were carried out in the same manner as Case 1 except that as the aging in Case 1, driving was carried out for 40 hours (at a frequency of 50 Hz) by repeating alternately the application of continuous 10 ms of a forward bias voltage of 12V and the application of continuous 10 ms without the application of bias voltage.

By the aging, the luminance per current density was 93% of the initial value. Subsequently, the change of the luminance per current density showed a monotonous reduction.

[Case 4]

Operations up to the measurement of the emission luminance lifetime were carried out in the same manner as Case 1 except that as the aging in Case 1, the organic EL display element was kept at an environment temperature of 55° C. for 100 hours without applying a bias voltage.

No reduction of the luminance per current density due to the keeping was recognized. The change of the luminance per current density showed a monotonous reduction.

[Case 5]

Operations up to the measurement of the emission luminance lifetime were carried out in the same manner as Case 1 except that as the aging in Case 1, driving was carried out for 80 hours (at a frequency of 50 Hz) by repeating alternately the application of continuous 5 ms of a forward bias voltage of 12V and the application of continuous 15 ms of a reverse bias voltage of 12V.

By the aging, the luminance per current density was 90% of the initial value. Subsequently, the change of the luminance per current density showed a monotonous reduction.

[Case 6]

Operations up to the measurement of the emission luminance lifetime were carried out in the same manner as Case 1 except that as the aging in Case 1, driving was carried out for 20 hours (at a frequency of 50 Hz) by repeating alternately the application of continuous 5 ms of a forward bias voltage of 12V and the application of continuous 15 ms of a reverse bias voltage of 12V, and the environment temperature was 55° C.

By the aging, the luminance per current density was 86% of the initial value. Subsequently, the change of the luminance per current density showed a monotonous reduction.

[Case 7]

Operations up to the measurement of the emission luminance lifetime were carried out in the same manner as Case 1 except that as the aging in Case 1, driving was carried out by repeating alternately the application of continuous 5 hours of a forward bias voltage of 12V and the application of continuous 15 hours of a reverse bias voltage of 12V, and the environment temperature was 55° C.

By the aging, the luminance per current density was 86% of the initial value. Subsequently, the change of the luminance per current density showed a monotonous reduction.

[Case 8]

Figure 6:
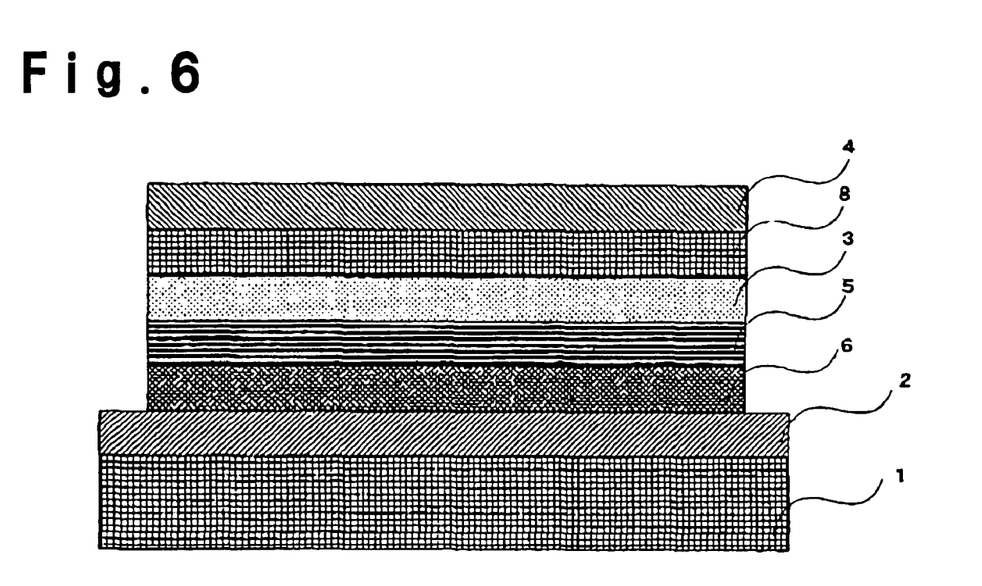
FIG. 6 is a schematic cross-sectional view illustrating another applied embodiment of the organic EL display element of the present invention.

On a glass substrate, ITO was vapor-deposited in a thickness of 200 nm to form an anode 2 having a sheet resistance of 7Ω/□. On this anode 2, a layer of copper phthalocyanine having a thickness of 20 nm was vapor-deposited as an interface layer 6 by a vacuum vapor deposition method and further, NPD of the formula (II) was vapor-deposited to form a hole transport layer 5 having a film thickness of 60 nm. Then, on the hole transport layer, Alq of the formula (III), coumarin 545T of the formula (IV) and NPD of the formula (II) were co-vapor-deposited by means of separate boats to form a light emitting layer 3 in a film thickness of 60 nm.

The concentration of the coumarin 545T was 1.0 mol %, and the concentration of NPD in the light emitting layer was 30 mol %. On the light emitting layer, a layer of LiF having a thickness of 0.5 nm as an interface layer 8 and an aluminum layer having a thickness of 200 nm as a cathode 4 were vapor-deposited sequentially to prepare an organic EL display element as shown in FIG. 6. The vacuum degree at that time was 0.00107 Pa.

As aging to the organic EL display element, driving was carried out for 40 hours (at a frequency of 50 Hz) by repeating alternately the application of continuous 10 ms of a forward bias voltage of 12V and the application of continuous 10 ms of a reverse bias voltage of 15V. The environment temperature was 20° C.

This organic EL display element was energized under conditions of 20° C. and a constant current driving (100 mA/cm$^2$) to emit light, and the time in which the luminance decreased to a half value was measured.

By the aging, the luminance per current density was 90% of the initial value. Subsequently, the change of the luminance per current density showed a monotonous reduction.

[Case 9]

Operations up to the measurement of the emission luminance lifetime were carried out in the same manner as Case 8 except that the aging was not carried out. The change of the luminance per current density showed a monotonous reduction.

[Case 10]

Operations up to the measurement of the emission luminance lifetime were carried out in the same manner as Case 8 except that as the aging in Case 8, driving was carried out for 100 hours (at a frequency of 100 Hz) by repeating alternately the application of continuous 0.125 ms of a forward bias voltage of 15V and the application of continuous 0.9875 ms of a reverse bias voltage of 10V, and the environment temperature was 85° C.

By the aging, the luminance per current density was 88% of the initial value. Subsequently, the change of the luminance per current density showed a monotonous reduction.

Table 1 shows results of the above Cases 1 to 10.

TABLE 1

| Case No. | Forward accumulation value (Vh) | Reverse accumulation value (Vh) | Reverse accumulation value/forward accumulation value | Aging time (h) | Environmental temperature (° C.) | Emission luminance lifetime (h) |
|---|---|---|---|---|---|---|
| Case 1 | 240 | 300 | 1.25 | 40 | 20 | 370 |
| Case 2 | 0 | 0 | — | — | — | 150 |
| Case 3 | 240 | 0 | 0 | 40 | 20 | 240 |
| Case 4 | 0 | 0 | — | 100 | 55 | 160 |
| Case 5 | 240 | 720 | 3.00 | 80 | 20 | 480 |
| Case 6 | 60 | 180 | 3.00 | 20 | 55 | 490 |
| Case 7 | 60 | 180 | 3.00 | 20 | 55 | 490 |
| Case 8 | 240 | 300 | 1.25 | 40 | 20 | 550 |
| Case 9 | 0 | 0 | — | — | — | 290 |
| Case 10 | 18.75 | 987.5 | 52.7 | 100 | 85 | 950 |

According to the present invention, it is possible to prepare an organic EL display element having an improved emission luminance lifetime and stabilized luminance characteristics.

What is claimed is:

1. A method for producing an organic electroluminescence display element having a light emitting layer between an anode and a cathode, wherein:

operations are carried out in the combination of aging in a forward direction wherein a voltage is applied to the light emitting layer under the condition that the potential of the anode is higher than the potential of the cathode and aging in a reverse direction wherein a voltage is applied to the light emitting layer under the condition that the potential of the cathode is higher than the potential of the anode, and the integration value with respect to an applied voltage and a voltage application time in the aging in a reverse direction is at least twice as much as the integration value with respect to an applied voltage and a voltage application time in the aging in a forward direction over the entire aging process.

2. The method for producing an organic electroluminescence display element according to claim 1, wherein aging is carried out at an environment temperature of from 50° C. to 110° C.

3. The method for producing an organic electroluminescence display element according to claim 2, wherein aging is carried out until the luminance per current density becomes 90% or less of the initial value.

4. The method for producing an organic electroluminescence display element according to claim 2, wherein aging is carried out until the change of the luminance per current density shows a monotonous reduction.

5. The method for producing an organic electroluminescence display element according to claim 2, wherein the light emitting layer comprises a compound A represented by the formula (III), a fluorescent dye and a compound B represented by the formula (II), and the proportion of the fluorescent dye is from 0.1 to 10 mol % and the proportion of the compound B is from 1 to 50 mol % based on the total amount of the compound A, the fluorescent dye and the compound B:

Formula (III)

Formula (II)

6. The method for producing an organic electroluminescence display element according to claim 2, wherein the integration value with respect to an applied voltage and a voltage application time in the aging in a reverse direction is 2–3 times as much as the integration value with respect to an applied voltage and a voltage application time in the aging in a forward direction over the entire aging process.

7. The method for producing an organic electroluminescence display element according to claim 3, wherein the integration value with respect to an applied voltage and a voltage application time in the aging in a reverse direction is 2–3 times as much as the integration value with respect to an applied voltage and a voltage application time in the aging in a forward direction over the entire aging process.

8. The method for producing an organic electroluminescence display element according to claim 4, wherein the integration value with respect to an applied voltage and a voltage application time in the aging in a reverse direction is 2–3 times as much as the integration value with respect to an applied voltage and a voltage application time in the aging in a forward direction over the entire aging process.

9. The method for producing an organic electroluminescence display element according to claim 5, wherein the integration value with respect to an applied voltage and a voltage application time in the aging in a reverse direction is 2–3 times as much as the integration value with respect to an applied voltage and a voltage application time in the aging in a forward direction over the entire aging process.

10. The method for producing an organic electroluminescence display element according to claim 1, wherein aging is carried out until the luminance per current density becomes 90% or less of the initial value.

11. The method for producing an organic electroluminescence display element according to claim 10, wherein aging is carried out until the change of the luminance per current density shows a monotonous reduction.

12. The method for producing an organic electroluminescence display element according to claim 10, wherein the light emitting layer comprises a compound A represented by the formula (III), a fluorescent dye and a compound B represented by the formula (II), and the proportion of the fluorescent dye is from 0.1 to 10 mol % and the proportion of the compound B is from 1 to 50 mol % based on the total amount of the compound A, the fluorescent dye and the compound B:

Formula (III)

Formula (II)

13. The method for producing an organic electroluminescence display element according to claim 10, wherein the integration value with respect to an applied voltage and a voltage application time in the aging in a reverse direction is 2–3 times as much as the integration value with respect to an applied voltage and a voltage application time in the aging in a forward direction over the entire aging process.

14. The method for producing an organic electroluminescence display element according to claim 11, wherein the integration value with respect to an applied voltage and a voltage application time in the aging in a reverse direction is 2–3 times as much as the integration value with respect to an applied voltage and a voltage application time in the aging in a forward direction over the entire aging process.

15. The method for producing an organic electroluminescence display element according to claim 1, wherein aging is carried out until the change of the luminance per current density shows a monotonous reduction.

16. The method for producing an organic electroluminescence display element according to claim 15, wherein the light emitting layer comprises a compound A represented by the formula (III), a fluorescent dye and a compound B represented by the formula (II), and the proportion of the fluorescent dye is from 0.1 to 10 mol % and the proportion of the compound B is from 1 to 50 mol % based on the total amount of the compound A, the fluorescent dye and the compound B:

Formula (III)

Formula (II)

Formula (III)

Formula (II)

17. The method for producing an organic electroluminescence display element according to claim 15, wherein the integration value with respect to an applied voltage and a voltage application time in the aging in a reverse direction is 2–3 times as much as the integration value with respect to an applied voltage and a voltage application time in the aging in a forward direction over the entire aging process.

18. The method for producing an organic electroluminescence display element according to claim 1, wherein the light emitting layer comprises a compound A represented by the formula (III), a fluorescent dye and a compound B represented by the formula (II), and the proportion of the fluorescent dye is from 0.1 to 10 mol % and the proportion of the compound B is from 1 to 50 mol % based on the total amount of the compound A, the fluorescent dye and the compound B:

19. The method for producing an organic electroluminescence display element according to claim 18, wherein the integration value with respect to an applied voltage and a voltage application time in the aging in a reverse direction is 2–3 times as much as the integration value with respect to an applied voltage and a voltage application time in the aging in a forward direction over the entire aging process.

20. The method for producing an organic electroluminescence display element according to claim 1, wherein the integration value with respect to an applied voltage and a voltage application time in the aging in a reverse direction is 2–3 times as much as the integration value with respect to an applied voltage and a voltage application time in the aging in a forward direction over the entire aging process.

* * * * *